June 1, 1965 F. D. FOLEY, JR 3,186,863
PROCESS FOR PLATING CERAMIC BODIES
Filed June 5, 1961
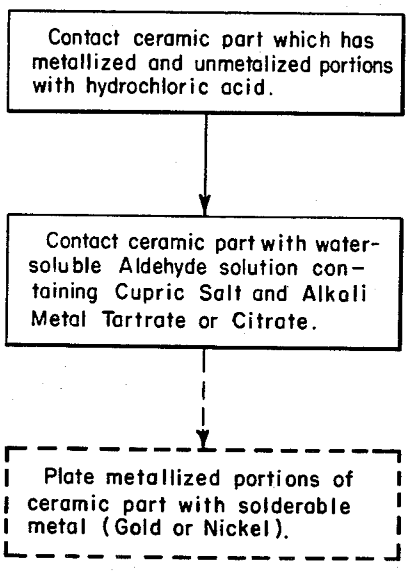
Francis D. Foley, Jr.
INVENTOR.
BY.
W Hleuoc Allister Jr
ATTORNEY.

United States Patent Office 3,186,863
Patented June 1, 1965

3,186,863
PROCESS FOR PLATING CERAMIC BODIES

Francis D. Foley, Jr., Newport Beach, Calif., assignor to Hughes Aircraft Company, Culver City, Calif., a corporation of Delaware Filed June 5, 1961, Ser. No. 114,679
9 Claims. (Cl. 117—45)

This invention relates to the metallizing of ceramic bodies whereby hermetic bonds or seals may be made to such bodies. More particularly the invention relates to methods and materials whereby selected portions of a ceramic body may be metallized without metallizing the entire ceramic body or otherwise adversely affecting its electrical insulating properties. The invention is of particular interest in applications where extremely small ceramic parts are involved, the small size of the parts making it extremely difficult to confine metallization and sealing to preselected portions thereof.

It is known that a ceramic body may be provided with a metallized surface to which other components or parts, of either metal or metallized ceramic, may be hermetically formed by soldering or brazing. The provision of a metallized surface is necessary because soldering or brazing directly to the ceramic with solderable materials results in unsatisfactory adherence and hermeticity. The usual practice therefore has been to provide the ceramic with a refractory metal layer which is fired and bonded to the ceramic; the best bonded metallized layers have been those of molybdenum and mixtures of molybdenum and iron or molybdenum and manganese. It will be appreciated that these metals, while having a strong affinity for the ceramic, are not readily susceptible to soldering and brazing. It has therefore been common to plate the metallized layer with a second metal which can be soldered or brazed; a typical metal for this purpose is nickel which is applied by either electrolytic or electroless plating processes. In the plating process it is necessary to immerse the metallized ceramic, or at least the portion to be plated, in a plating solution. Likewise in electrolytic plating processes it is necessary to make electrode connections to the part to be plated. It will be appreciated, however, that when the ceramic part is extremely small, making electrode connections and restricting the immersion of the part to only the portion to be plated are exceedingly difficult and exacting operations. It would, in these instances, be of considerable advantage if the parts could be totally immersed in an electroless plating solution but with only the metallized portions becoming plated. A typical small ceramic part which must be metallized, plated and eventually hermetically sealed is a ceramic envelope for semiconductor devices such as shown and described in the copending application of William B. Warren, Serial No. 861,277, filed December 22, 1959 and assigned to the instant assignee, now Patent No. 3,142,783. This ceramic envelope is about 0.050" in diameter and about 0.030" high. Only the ends of these cylinders, to which metallic caps are to be hermetically sealed, need be metallized and plated. Plating by immersion, however, does result in some plating of the unmetallized portions which while not of mechanical significance, does adversely affect the electrically insulating nature of the ceramic and tends to provide a path for electrically shorting the semiconductor device provided therein and attached, eventually, to the metal end caps.

It is therefore an object of the present invention to provide an improved process for plating a metallized ceramic body.

Another object of the invention is to provide an improved process for selectively plating only metallized portions of ceramic bodies.

These and other objects and advantages of the invention are realized by subjecting the ceramic body, having previously metallized portions, to a treatment by which only the metallized portions are rendered sensitive or are activated to the plating solution, the unmetallized portions of the ceramic body being rendered substantially immune or inactive to plating.

The sole figure of the drawing is a flow chart of the process of the invention with dotted line portions indicating an alternate additional step.

The ceramic body is first provided with selected metallized portions by painting these portions by brush with a mixture of molybdenum and manganese dispersed in a suitable binder. A satisfactory metallizing mixture, for example, may comprise 14 parts of finely divided molybdenum and manganese powders and 4 parts isobutyl methacrylate thinned with 1 part butyl Carbitol acetate all parts being by weight. The ratio, by weight, of molybdenum to manganese may be about 2 to 1. This will provide a mixture of paint-like consistency which can be readily brushed onto preselected areas of the ceramic body. The ceramic material itself may be of the alumina type wherein about 96% of the material is aluminum trioxide, although beryllia ceramic materials may be successfully employed in the practice of the present invention.

The next step to bond the molybdenum-manganese to the ceramic is firing the thus-coated ceramic body in an atmosphere of hydrogen (which has been bubbled through water) at a temperature of about 1250° C. for about 30 minutes. The cured ceramic body is then cooled to room temperature and thoroughly cleansed. A typical and satisfactory cleansing procedure is total immersion in an alkaline solution for three minutes at a temperature of about 160° F., for example, followed by thorough rinsing in water. A satisfactory alkaline solution may be made up as follows:

| | |
|---|---|
| Sodium hydroxide | 10 g. |
| Sodium carbonate | 25 g. |
| Trisodium phosphate | 25 g. |
| Water | 1 l. |

The ceramic body is then immersed in concentrated hydrochloric acid. This step has been discovered to be necessary to render only the metallized portions receptive to the plating step which follows so that only the metallized portions are plated. This activation or plating-sensitization step may be accomplished by immersing the ceramic body in a 9 N solution of hydrochloric acid at a temperature of about 140° F. for about two minutes. It will be appreciated that the temperatures, concentrations, and times involved in this step are inter-dependent and may be varied considerably. Thus, for example, with a 9 N solution at room temperature a longer period of immersion would be in order. A stronger solution on the other hand would indicate the feasibility of lower temperatures and shorter immersion times; weaker solutions would call for higher temperatures and longer immersion times. Such relationships are well understood in the art and the precise procedure employed may be predicated upon the desires of the operator as to whether it is more efficient and economical to employ longer reaction times with weaker solutions or lower temperatures. It has been found in the practice of the process of the invention that acid concentrations of from 4 N to 9 N permit efficient and economical operation.

After thorough rinsing again in water, preferably deionized or distilled water, the ceramic body is immersed in a copper-plating solution and the molybdenum-manganese metallized portions only are plated electrolessly with copper. It has been found that copper-plating solutions exhibit a preference for plating onto these metallized portions of the ceramic body. To summarize briefly the process at this point, if the acid-activation step is omitted, the copper will be plated more or less indiscriminately over metallized and un-metallized portions of the ceramic body; on the other hand, when the acid-activation step is employed, copper plating solutions exhibit the preferential plating action on the metallized portions of the ceramic.

Suitable copper-plating solutions may be made up as shown in the following examples. These solutions comprise a cupric salt solution mixed with an alkaline tartrate solution to which mixture a water soluble aldehyde is added. For plating purposes the cupric ion is needed, hence the cupric salt and the alkaline tartrate solution serves to establish a solution of the complex cupric ion with the tartrate ion. The solution is very similar to Fehling's solution except for the addition of the water soluble aldehyde which causes the cupric ion to plate onto the metallized portions of the ceramic body. In addition the examples demonstrate other variations from the standard Fehling's solution which is usually made up of cupric sulfate, Rochelle salts (sodium potassium tartrate), and sodium hydroxide. Thus salts other than cupric sulfate may be used and the tartrate may be substituted for by a citrate.

*Example I.—Modified Fehling's solution*

| | | Parts (vol.) |
|---|---|---|
| (a) Solution No. 1 | | 5 |
| $NaKC_4H_4O_6.4H_2O$ | g | 173.0 |
| NaOH | g | 50.0 |
| $H_2O$ | ml | 500.0 |
| (b) Solution No. 2 | | 5 |
| $CuSO_4.5H_2O$ | g | 35.0 |
| $H_2O$ | ml | 500.0 |
| (c) Solution No. 3 | | 2 |
| HCHO | percent | 37 |

*Example II.—Cupric nitrate and alkaline tartrate solution*

| | | Parts (vol.) |
|---|---|---|
| (a) Solution No. 1 same as in Example I | | 5 |
| (b) Solution No. 2 | | 5 |
| $Cu(NO_3)_2.3H_2O$ | g | 32.0 |
| $H_2O$ | ml | 500.0 |
| (c) Solution No. 3 same as in Example I | | 2 |

*Example III.—Cupric acetate and alkaline tartrate solution*

| | | Parts (vol.) |
|---|---|---|
| (a) Solution No. 1 same as in Example I | | 5 |
| (b) Solution No. 2 | | 5 |
| $Cu(C_2H_3O_2)_2.H_2O$ | g | 25.6 |
| $H_2O$ | ml | 500.0 |
| (c) Solution No. 3 same as in Example I | | 2 |

*Example IV.—Cupric chloride and alkaline tartrate solution*

| | | Parts (vol.) |
|---|---|---|
| (a) Solution No. 1 same as in Example I | | 5 |
| (b) Solution No. 2 | | 5 |
| $CuCl_2.2H_2O$ | g | 24.0 |
| $H_2O$ | ml | 500.0 |
| (c) Solution No. 3 same as in Example I | | 2 |

*Example V.—Cupric ammonium chloride and alkaline tartrate solution*

| | | Parts (vol.) |
|---|---|---|
| (a) Solution No. 1 same as in Example I | | 5 |
| (b) Solution No. 2 | | 5 |
| $CuCl_2.2NH_4Cl.2H_2O$ | g | 29.4 |
| $H_2O$ | ml | 500.0 |
| (c) Solution No. 3 same as in Example I | | 2 |

*Example VI.—Cupric sulfate and Potassium tartrate solution*

| | | Parts (vol.) |
|---|---|---|
| (a) Solution No. 1 | | 5 |
| $K_2C_4H_4O_6.½H_2O$ | g | 88.0 |
| NaOH | g | 100.0 |
| $H_2O$ | ml | 500.0 |
| (b) Solution No. 2 same as in Example I | | 5 |
| (c) Solution No. 3 same as in Example I | | 2 |

*Example VII.—Cupric sulfate and sodium tartrate solution*

| | | Parts (vol.) |
|---|---|---|
| (a) Solution No. 1 | | 5 |
| $Na_2C_4H_4O_6.2H_2O$ | g | 53.5 |
| NaOH | g | 100.0 |
| $H_2O$ | ml | 500.0 |
| (b) Solution No. 2 same as in Example I | | 5 |
| (c) Solution No. 3 same as in Example I | | 2 |

*Example VIII.—Cupric sulfate and sodium citrate solution*

| | | Parts (vol.) |
|---|---|---|
| (a) Solution No. 1 | | 5 |
| $Na_3C_6H_5O_7.2H_2O$ | g | 129.0 |
| NaOH | g | 100.0 |
| $H_2O$ | ml | 500.0 |
| (b) Solution No. 2 same as in Example I | | 5 |
| (c) Solution No. 3 same as in Example I | | 2 |

*Example IX.—Cupric sulfate and sodium potassium tartrate solution*

| | | Parts (vol.) |
|---|---|---|
| (a) Solution No. 1 | | 5 |
| $KNaC_4O_6.4H_2O$ | g | 173.0 |
| KOH | g | 100.0 |
| $H_2O$ | ml | 500.0 |
| (b) Solution No. 2 same as in Example I | | 5 |
| (c) Solution No. 3 same as in Example I | | 2 |

The acid-activated metallized ceramic body is immersed in one of these solutions at room temperature for about ten minutes. With this solution at this temperature the plating rate is about 1 mil of copper per hour, hence about ⅙ of a mil is deposited on the metallized portions of the ceramic body in ten minutes. This amount of plated copper has been found satisfactory for the purposes of this invention.

Once the molybdenum-manganese metallized portions have been plated with copper these portions may be readily preferentially plated with nickel or gold or other solderable metals to the exclusion of the unmetallized portions of the ceramic body. Heretofore, with a molybdenum-manganese metallized surface alone, there was no preferential plating in conventional electroless nickel or gold-plating solutions.

After thorough rinsing, as in distilled water, the copper-plated portions of the ceramic body may be plated electrolessly with nickel by the following solution in which the ceramic body is immersed at a temperature of 90–95° C. for about 30 minutes whereby a plating of nickel about 0.0002" thick is provided.

| Nickel plating solution: | Grams/liter |
|---|---|
| Nickel sulfate | 35.0 |
| Sodium citrate | 10.0 |
| Sodium acetate | 10.0 |
| Sodium Hypophosphite | 15.0 |
| Magnesium sulfate (anhydrous) | 20.0 |
| Sodium lauryl sulfate | 0.1 |

Alternatively, the copper-plated portions may be electrolessly provided with a gold-plating about 0.0001" thick by immersing the ceramic body in the following solution at a temperature of about 60–70° C. for about 10 minutes.

| Gold plating solution: | Grams/liter |
|---|---|
| Potassium gold cyanide | 11.2 |
| Potassium cyanide | 10.5 |

The ceramic body may now be readily joined and hermetically sealed to another ceramic body also prepared as described or to a metal body by conventional soldering or brazing techniques. Thus the ceramic envelope shown and described in the aforementioned copending Warren application may have its end portions metallized by the procedures set forth herein and hermetically sealed by means of metal end caps or plates which are soldered or fused to these metallized end portions. The end caps of the container thus provided may be electrically connected to opposite sides of a semiconductor crystal body having a P–N junction therein whereby the end caps constitute the electrical leads for the device which leads are electrically insulated from each other by the unmetallized ceramic portions of the envelope between the caps.

There thus has been described a novel and useful method for selectively plating only the metallized portions of a ceramic body so that hermetic seals may be made to these metallized portions. While certain steps and materials, namely, the activation of metallized portions with hydrochloric acid and the subsequent plating with copper, appear to be essential, it should be appreciated that such factors as reaction times and temperatures as well as solution concentrations are quite variable and the benefits and advantages of the method of the invention may still be realized by substantial departures from the specific times, temperatures, and concentrations set forth herein by way of example. Likewise solutions and procedures for plating the copper-plated portions of the ceramic body other than those included herein may be employed, such alternate solutions and procedures being well-understood in the plating art.

What is claimed is:

1. The method of providing only a metallized portion of a ceramic body having metallized and unmetallized portions with a plating of copper comprising the steps of: contacting portions of said body including said metallized portions with a solution consisting essentially of hydrochloric acid so as to sensitize only said metallized portions of said body for said plating, and then placing said body in contact with a solution of a water soluble aldehyde containing a cupric salt and an alkali metal compound selected from the group consisting of tartrates and citrates.

2. The method according to claim 1 wherein said solution is Fehling's solution modified by the addition of said water soluble aldehyde.

3. The method according to claim 2 wherein said aldehyde is formaldehyde.

4. The method according to claim 2 wherein said cupric salt is selected from the group consisting of cupric sulfate, cupric nitrate, cupric acetate, cupric chloride, and cupric ammonium chloride.

5. The method of providing only a metallized portion of a ceramic body having metallized and unmetallized portions with a plating of copper comprising the steps of: contacting portions of said body including said metallized portions with a solution consisting essentially of hydrochloric acid so as to sensitize only said metallized portions of said body for said plating, and then placing said body in contact with a solution containing a cupric salt, a water soluble aldehyde, and an alkali metal tartrate.

6. The method of providing only a metallized portion of a ceramic body having metallized and unmetallized portions with a plating of copper comprising the steps of: contacting portions of said body including said metallized portions with a solution consisting essentially of hydrochloric acid so as to sensitize only said metallized portions of said body for said plating, and then placing said body in contact with a solution containing a cupric salt, a water soluble aldehyde, and an alkali metal citrate.

7. The method of depositing copper only on molybdenum-manganese metallized portions of a ceramic body having metallized and unmetallized portions comprising the steps of: contacting portions of said body including said metallized portions with a solution consisting essentially of hydrochloric acid so as to sensitize only said metallized portions of said body for said plating, and then placing said body in contact with an alkaline plating bath containing a cupric salt, alkali metal tartrate, and a water soluble aldehyde.

8. The method of depositing copper only on molybdenum-manganese metallized portions of a ceramic body having metallized and unmetallized portions comprising the steps of: contacting portions of said body including said metallized portions with a solution consisting essentially of hydrochloric acid so as to sensitize only said metallized portions of said body for said plating, and then placing said body in contact with an alkaline plating bath containing a cupric salt, alkali metal citrate, and a water soluble aldehyde.

9. The method of providing only a metallized portion of a ceramic body having metallized and unmetallized portions with a plating of metal susceptible to soldering and the like comprising the steps of: contacting portions of said body including said metallized portions with a solution consisting essentially of hydrochloric acid so as to sensitize only said metallized portions of said body for said plating, and then placing said body in contact with a solution of a water-soluble aldehyde containing a cupric salt and an alkali metal compound selected from the group consisting of tartrates and citrates, and then plating the copper-plated portion thus obtained with a solderable metal selected from the group consisting of gold and nickel.

References Cited by the Examiner

UNITED STATES PATENTS

| | | | |
|---|---|---|---|
| 2,357,550 | 9/44 | Rowland et al. | |
| 2,662,270 | 12/53 | Mitchell | 117—22 X |
| 2,667,427 | 1/54 | Nolte | 117—71 X |
| 3,023,492 | 3/62 | Bristow | 117—227 |

RICHARD D. NEVIUS, *Primary Examiner.*

UNITED STATES PATENT OFFICE
CERTIFICATE OF CORRECTION

Patent No. 3,186,863 June 1, 1965

Francis D. Foley, Jr.

It is hereby certified that error appears in the above numbered patent requiring correction and that the said Letters Patent should read as corrected below.

Column 1, line 30, for "molybdenum and mixtures" read -- molybdenum or mixtures --; column 5, lines 51 and 53, for the claim reference numeral "2", each occurrence, read -- 1 --.

Signed and sealed this 22nd day of March 1966.

(SEAL)
Attest:

ERNEST W. SWIDER
Attesting Officer

EDWARD J. BRENNER
Commissioner of Patents